(12) United States Patent
Gee et al.

(10) Patent No.: US 10,686,160 B2
(45) Date of Patent: Jun. 16, 2020

(54) DISPLAY PANEL AND MANUFACTURING METHOD OF THE SAME

(71) Applicant: LG DISPLAY CO., LTD., Seoul (KR)

(72) Inventors: Moon Bae Gee, Paju-si (KR); Han Sun Park, Paju-si (KR); Su Hyeon Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 247 days.

(21) Appl. No.: 15/505,481

(22) PCT Filed: Aug. 18, 2015

(86) PCT No.: PCT/KR2015/008597
§ 371 (c)(1),
(2) Date: Feb. 21, 2017

(87) PCT Pub. No.: WO2016/032160
PCT Pub. Date: Mar. 3, 2016

(65) Prior Publication Data
US 2017/0256752 A1     Sep. 7, 2017

(30) Foreign Application Priority Data

Aug. 29, 2014 (KR) .................. 10-2014-0113713

(51) Int. Cl.
*H01L 51/52* (2006.01)
*H01L 27/32* (2006.01)
*H01L 51/56* (2006.01)

(52) U.S. Cl.
CPC ........ *H01L 51/5281* (2013.01); *H01L 27/322* (2013.01); *H01L 27/3211* (2013.01);
(Continued)

(58) Field of Classification Search
CPC ............. H01L 51/5281; H01L 27/3211; H01L 51/5234
(Continued)

(56) References Cited

U.S. PATENT DOCUMENTS

2010/0007270 A1*  1/2010  Suh ..................... H01L 27/322
                                              313/504
2013/0135558 A1   5/2013  Kim et al.
(Continued)

FOREIGN PATENT DOCUMENTS

CN        103135281 A    6/2013
EP         1434283 A2    6/2004
(Continued)

*Primary Examiner* — Bo Fan
(74) *Attorney, Agent, or Firm* — Birch, Stewart, Kolasch & Birch, LLP (57) ABSTRACT

Disclosed herein is a display panel including a polarizing emission layer. An organic light emitting device is formed on a first substrate. A polarizing emission layer are formed on a second substrate facing the first substrate. The polarizing emission layer is formed in a subpixel area corresponding to the organic light emitting device. The polarizing emission layer includes quantum rods. The quantum rods are aligned in one direction to be polarized. Accordingly, loss of transmitting light in the display panel including the polarizing layer may be minimized. In addition, since colors are implemented by the quantum rods included in the polarizing emission layer, color filters can be replaced by the quantum rods, and loss of light resulting from the color filters may be minimized.

10 Claims, 9 Drawing Sheets

(52) U.S. Cl.
CPC ...... *H01L 27/3244* (2013.01); *H01L 51/5234* (2013.01); *H01L 51/5293* (2013.01); *H01L 51/56* (2013.01); *H01L 2251/5369* (2013.01)

(58) Field of Classification Search
USPC ........................................ 257/40, 98; 438/22
See application file for complete search history.

(56) References Cited

U.S. PATENT DOCUMENTS

| | | | |
|---|---|---|---|
| 2014/0027738 A1 | 1/2014 | Lee | |
| 2014/0191203 A1* | 7/2014 | Son | H01L 51/5284 257/40 |

FOREIGN PATENT DOCUMENTS

| | | |
|---|---|---|
| JP | 2012-204012 A | 10/2012 |
| KR | 10-2010-0007265 A | 1/2010 |
| KR | 10-2013-0059221 A | 6/2013 |
| KR | 10-2013-0059222 A | 6/2013 |
| KR | 10-2013-0061857 A | 6/2013 |
| KR | 10-2014-0090911 A | 7/2014 |

* cited by examiner

DISPLAY PANEL AND MANUFACTURING METHOD OF THE SAME

CROSS-REFERENCED TO RELATED APPLICATIONS

This application is the National Phase of PCT International Application No. PCT/KR2015/008597 filed on Aug. 18, 2015, which claims priority under 35 U.S.C. 119(a) to Korean Patent Application No. 10-2014-0113713 filed on Aug. 29, 2014 in Republic of Korea. All of these applications are hereby expressly incorporated by reference into the present application.

BACKGROUND OF THE INVENTION

Technical Field

The present disclosure relates to a display panel and a method of manufacturing the same and, more particularly, a display panel provided with a polarizing emission layer to improve light efficiency and reduce power consumption and a method of manufacturing the same.

Background Art

Recently, display panels such as a liquid crystal display (LCD) and an organic light-emitting diode display (OLED) have come into the spotlight as flat display panels.

In particular, the OLED, which is a self-luminous display device, does not require a separate light source. Therefore, the OLED can be manufactured into a lightweight and thin form. In addition, the OLED is operated at low voltage and thus advantageous in terms of power consumption. Moreover, the OLED exhibits high performance in color implementation, response rate, response time, viewing angle, and contrast ratio (CR). For these reasons, the OLED has been studied as the next generation display.

To implement colors on such display panels, each pixel is provided with color filters for implementing red, green and blue lights.

If the display is designed to emit red, green and blue light, each pixel may not need to be provided with color filters. However, for a white organic light emitting device, however, color filters are required to implement colors.

For the OLED display, an electrode provided in the organic light emitting device causes reflection of external light, thereby lowering visibility. In this case, a polarizing layer may be used to enhance visibility.

When color filters are used, the intensity of light transmitted through the filters may be lowered due to transmittance of the filters. To address this issue, various technologies have been introduced.

SUMMARY OF THE INVENTION

When color filters are used to implement colors on a flat display panel, loss of transmitting light occurs due to transmittance of the color filters. Further, for a display panel employing organic light emitting devices, a polarizing layer is used to suppress reflection of external light which causes degradation of visibility. However, using the polarizing layer still results in loss of transmitting light. In this regard, a display panel capable of minimizing loss of transmitting light regardless of the existence of the polarizing layer is proposed in the present disclosure.

An object of the present disclosure is to provide a display panel capable of implementing colors with a polarizing emission layer in place of a color filter that is conventionally used to implement colors and minimizing loss of transmitting light and a manufacturing method for the same.

Another object of the present disclosure is to provide a display panel for preventing a polarizing layer from causing loss of transmitting light by using a polarizing emission layer arranged in the same polarization direction as a polarizing layer and a manufacturing method for the same.

It should be noted that objects of the present disclosure are not limited to the aforementioned objects, and other objects of the present disclosure will be apparent to those skilled in the art from the following descriptions.

According to an aspect of the present disclosure, there is provided a display panel including a polarizing emission layer. The display panel includes a first substrate having a plurality of subpixel areas defined to constitute one unit pixel, and a second substrate facing the first substrate. An organic light emitting device including a driving device, a pixel electrode, an organic emission layer and a common electrode is formed on the second substrate. A polarizing emission layer including quantum rods is formed on the dummy electrodes formed on the first substrate.

In one or more embodiments, the quantum rod is a material having a diameter within 100 nm. The quantum rod emits light according to the quantum confinement effect with the quantum rod is exposed to light, and the color depends on the size of the quantum rod. If the aspect ratio of the quantum rod is greater than or equal to 1:1, the quantum rod emits polarized light in the longitudinal direction when depolarized light is incident on the quantum rod. By using the polarizing emission layer including the quantum rod layer, loss of transmitting light which may occur when color filters are used, may be minimized.

In one or more embodiments, in forming the polarizing emission layer including the quantum rod layer, the dummy electrodes are formed adjacent to the quantum rods layer, and when a current is applied to the dummy electrodes, the quantum rods are aligned in the direction of the current by dipole moment, polarizing the polarizing emission layer.

The polarizing emission layer may be arranged such that the polarization direction of the polarizing emission layer coincides with the polarization direction of a polarizing layer attached to the display panel. Thus, loss of light may be minimized even when the polarizing layer is attached to the display panel.

The organic light emitting device may include a driving device, a pixel electrode, an organic emission layer and a common electrode.

The organic emission layer may be a blue organic emission layer.

The organic emission layer may be an ultraviolet (UV) organic emission layer capable of emitting light of a UV wavelength.

The common electrode may be a transparent electrode.

The dummy electrodes may be transparent electrodes. The dummy electrodes may be formed to correspond to the polarizing emission layer.

The polarizing emission layer may include quantum rods.

The quantum rods may be selected from among red quantum rods, blue quantum rods and green quantum rods.

The display panel may further include a polarizing layer.

A polarization direction of the polarizing emission layer may coincide with a polarization direction of the polarizing layer.

According to another aspect of the present disclosure, there is provided a method for manufacturing a display panel. The method includes forming an organic light emitting device on a first substrate, forming a plurality of dummy electrodes on a second substrate, and forming a polarizing emission layer on the second substrate. Herein, forming the polarizing emission layer on the second substrate includes applying current to the dummy electrodes to secure polarization of the polarizing emission layer, and attaching the first substrate to the second substrate.

Forming the dummy electrodes may include performing dry etching using a mask.

Forming the dummy electrodes may include performing patterning such that the dummy electrodes have a comb pattern.

Forming the polarizing emission layer may include applying quantum rods mixed with a volatile solvent.

According to an embodiment of the present disclosure, as a polarizing emission layer is provided, colors can be implemented without using a color filter. Accordingly, loss of transmitting light caused by the color filter may be minimized.

According to an embodiment of the present disclosure, a polarizing emission layer including quantum rods emits polarized light. Thus, loss of transmitting light caused by a polarizing layer may be minimized.

In addition, dummy electrodes adjust current to control electrical properties of quantum rods when a display panel is driven. Thus, the intensity of light emitted from a polarizing emission layer can be adjusted.

Further, as self-emission of the polarizing emission layer increases the light efficiency, power consumption in the display panel maybe reduced, and the reliability of the display panel may be enhanced in terms of the service life of the display panel.

It should be noted that effects of the present disclosure are not limited to those described above and other effects of the present disclosure will be apparent to those skilled in the art from the following descriptions.

It is to be understood that both the foregoing general description and the following detailed description of the present disclosure are exemplary and explanatory and are not intended to specify essential limitations recited in the claims. Therefore, the scope of the claims is not restricted by the foregoing general description and the following detailed description of the present disclosure.

DETAILED DESCRIPTION OF THE PREFERRED EMBODIMENTS

Advantages and features of the present disclosure and methods to achieve them will become apparent from the descriptions of exemplary embodiments herein below with reference to the accompanying drawings. However, the present disclosure is not limited to the exemplary embodiments disclosed herein but may be implemented in various different forms. The exemplary embodiments are provided to make the description of the present disclosure thorough and to fully convey the scope of the present disclosure to those skilled in the art. It is to be noted that the scope of the present disclosure is defined only by the claims.

The figures, dimensions, ratios, angles, numbers of elements given in the drawings are merely illustrative and are not limiting. Like reference numerals denote like elements throughout the descriptions. Further, in describing the present disclosure, descriptions of well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even if explicit statements are not made.

In describing positional relationship using phrases such as "an element A on an element B," "an element A above an element B," "an element A below an element B" and "an element A next to an element B," another element C may be disposed between the elements A and B unless the term "immediately" or "directly" is explicitly used.

In describing temporal relationship, terms such as "after," "subsequent to," "next to," "before," and the like may include cases where any two events are not consecutive, unless the term "immediately" or "directly" is explicitly used.

In describing elements, terms such as "first" and "second" are used, but the elements are not limited by these terms. These terms are simply used to distinguish one element from another. Accordingly, as used herein, a first element may be a second element within the technical idea of the present disclosure.

Features of various exemplary embodiments of the present disclosure maybe partially or fully combined. As will be clearly appreciated by those skilled in the art, technically various interactions and operations are possible. Various exemplary embodiments can be practiced individually or in combination.

Hereinafter, description will be given of various constituent of a display panel including a polarizing emission layer according to an embodiment of the present disclosure.

A quantum rod is a material whose diameter is within 100 nm. When the quantum rod is exposed to light, it emits light of a color according to the quantum confinement effect. The color of the light depends on the configuration and length of the quantum rod.

When the aspect ratio of the quantum rod is greater than or equal to 1:1, the quantum rod emits polarized light in the longitudinal direction. In particular, if the quantum rod has the wurtzite crystal structure, polarization of the quantum rod becomes more preferable.

Hereinafter, various embodiments of the present disclosure will be described in detail with reference to the accompanying drawings.

Figure 1A:
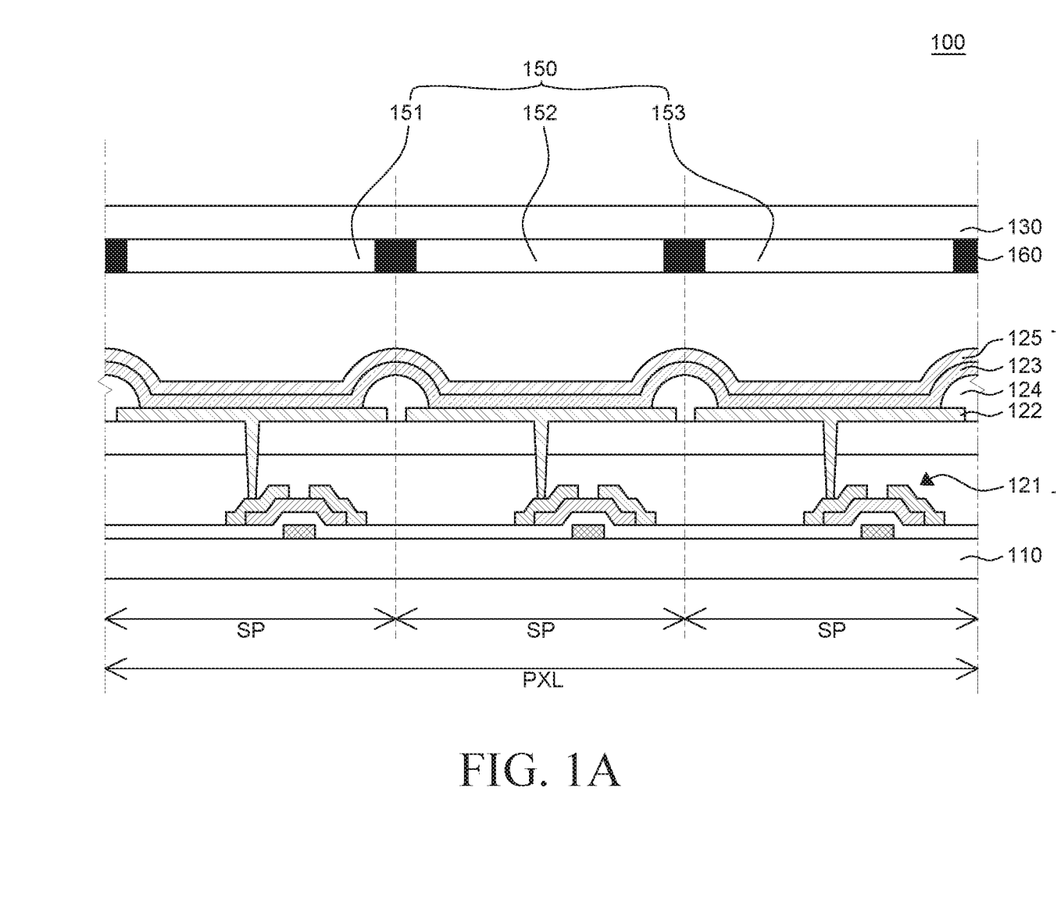
FIG. 1A is a schematic cross-sectional view of a display panel including a polarizing emission layer corresponding to all subpixels according to an embodiment of the present disclosure.

FIG. 1A is a schematic cross-sectional view of a display panel including a polarizing emission layer corresponding to all subpixels according to an embodiment of the present disclosure.

While FIG. 1A illustrate a display technique based on organic light emission, the illustration may also be applied to a light emission technique used in, for example, a liquid crystal display.

A display panel 100 includes a first substrate 110 and an organic light emitting device 120.

Disposed on the first substrate 110 are a driving device 121 and a pixel electrode 122 connected to the driving device 121.

An organic emission layer 123, a common electrode 125 and a bank layer 124 are formed on the pixel electrode 122. The bank layer 124 is formed to distinguish among subpixels SP defining a unit pixel PXL. The common electrode 125 may be a transparent electrode formed of a transparent conductive oxide.

Meanwhile, a second substrate 130 is provided to face the first substrate 110.

A polarizing emission layer 150 and a black matrix 160 are disposed below the second substrate 130. The second substrate may or may not include a polarizing layer 170 depending on design.

The polarizing emission layer 150 may include a red polarizing emission layer 151, a green polarizing emission layer 152 and a blue polarizing emission layer 153, each of which is capable of implementing at least one color. However, embodiments of the present disclosure are not limited thereto.

The polarizing emission layer 150 includes quantum rods (not shown). When the light emitted from the organic light emitting device 120 included in the first substrate 110 is incident on the quantum rods (not shown), the quantum rods emit light on their own according to the quantum confinement effect. The polarizing emission layer 150 may include quantum rods selected from among red quantum rods, blue red quantum rods and green quantum rods.

The light incident on the polarizing emission layer 150 may be ultraviolet (UV) light, and a corresponding UV organic light emitting device may be used. However, embodiments of the present disclosure are not limited thereto.

The material and composition of the quantum rods capable of implementing various colors may be defined as shown in Table 1 below.

TABLE 1

Types and Properties of Quantum Rods

| Implemented color/ wavelength | Band gap structure and composition | Band gap type | Ligand | Diameter/ Length | Note |
| --- | --- | --- | --- | --- | --- |
| RED/ 610~640 nm | ZnSe/CdS | Type-II | Alkyl Phosphonic acid, Trioctyl-phosphine | 4~6 nm/ 20~80 nm | Core/ Shell |

TABLE 1-continued

Types and Properties of Quantum Rods

| Implemented color/ wavelength | Band gap structure and composition | Band gap type | Ligand | Diameter/ Length | Note |
| --- | --- | --- | --- | --- | --- |
| Green/ 530~550 nm | CdSe/Cds | Quasi Type-I | Alkyl Phosphonic acid, Trioctyl-phosphine oxide | 3~5 nm/ 20~80 nm | Core/ Shell |
| Blue/ 430~480 nm | Cds | Single bandgap | Alkylamine | 4~6 nm/ 20~80 nm | Single Core |

Types and Properties of Quantum Rods

In quantum rods, particle aggregation may occur due to attraction among particles that are structured through surface treatment with a ligand. In order to prevent particle aggregation and disperse the particles, an organic material (ligand) having a length of a certain chain is attached to a particle surface A different ligand is used depending on an environment (solvent) in which the ligand is dispersed. At least one ligand is used.

A core has a crystallized structure formed of one or two elements.

A core/shell is structured by surrounding the core with a structure having a different band gap from that of the core.

For Type I, the band gap of the core is smaller than the band gap of the shell. For Type II, the band gap of the core is larger than the band gap of the shell.

The second substrate 130 does not include the polarizing layer, but the reflection of the external light can be minimized since the quantum rods of the polarizing emission layer 160 are aligned in a polarization direction as the polarizing layer.

The quantum rods with the constant polarizing direction as the polarizing layer can be implemented in various embodiments and are not limited to a specific type. The quantum rods can be arranged to polarize the incident light to one direction by applying magnetic or electric forces from outside. For example, an electrode applying the magnetic or electronic forces can be mounted on moving means such that it can be disposed outer side of the display panel 100 and by moving the moving means to a specific direction, the quantum rods of the polarizing emission layer 160 of the display panel 100 can be arranged in accordance with the movement of the moving means. In the alternative, an electrode for arranging the quantum rods are included within in the polarizing emission layer 160, and by applying a certain voltage to the electrode, the arrangement of the quantum rods of the adjacent polarizing emission layer 160 can be adjusted. As such, the polarizing emission layer 160 can reduce the reflection of the incident external light and the visibility of the display panel can be enhanced.

Figure 1B:
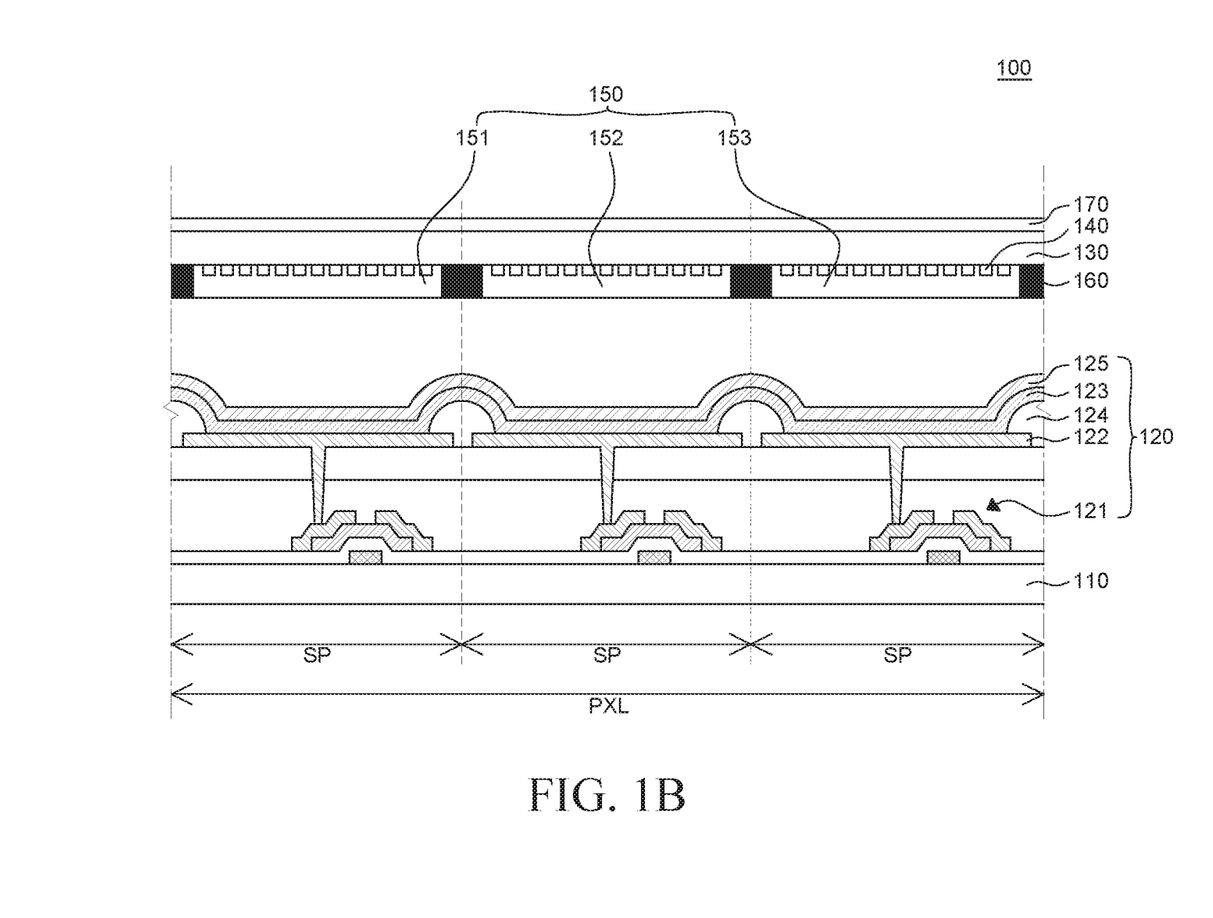
FIG. 1B is a schematic cross-sectional view of a display panel including a polarizing layer and dummy electrodes according to an embodiment of the present disclosure.

FIG. 1B is a schematic cross-sectional view of a display panel including a polarizing layer and dummy electrodes according to an embodiment of the present disclosure.

Referring to FIG. 1B, the display panel 100 includes the first substrate 110, the organic light emitting device 120, the second substrate 130, a dummy electrode 140, the polarizing emission layer 150, the black matrix 160, and the polarizing layer 170.

The display panel 100 in FIG. 1B additionally includes the polarizing layer 170 on the second substrate 130 in the display panel 100 of FIG. 1A. The display panel 100 including the polarizing layer 170 is configured such that the polarizing emission layer 150 and the polarizing layer 170 have an identical polarization direction.

First, the light reflected by the polarizing layer 170 is reduced and as the polarization directions of the polarizing emission layer 160 and the polarizing layer 170 are coincided, the light emitting efficiency from the display panel 100 can be maintained and not reduced.

A method to determine the polarization direction of the polarizing emission layer 150 that coincides with the polarization direction of the polarizing layer 170 will be described below.

The Display panel 100 of FIG. 1B represents an embodiment in which dummy electrodes 140 are disposed within polarizing emission layer 150. To coincide the polarization direction of the quantum rods of the polarizing emission layer 150 with the polarization direction of the polarizing layer 170, a voltage is applied to the dummy electrodes 140 and the quantum rods are arranged.

Figure 1C:
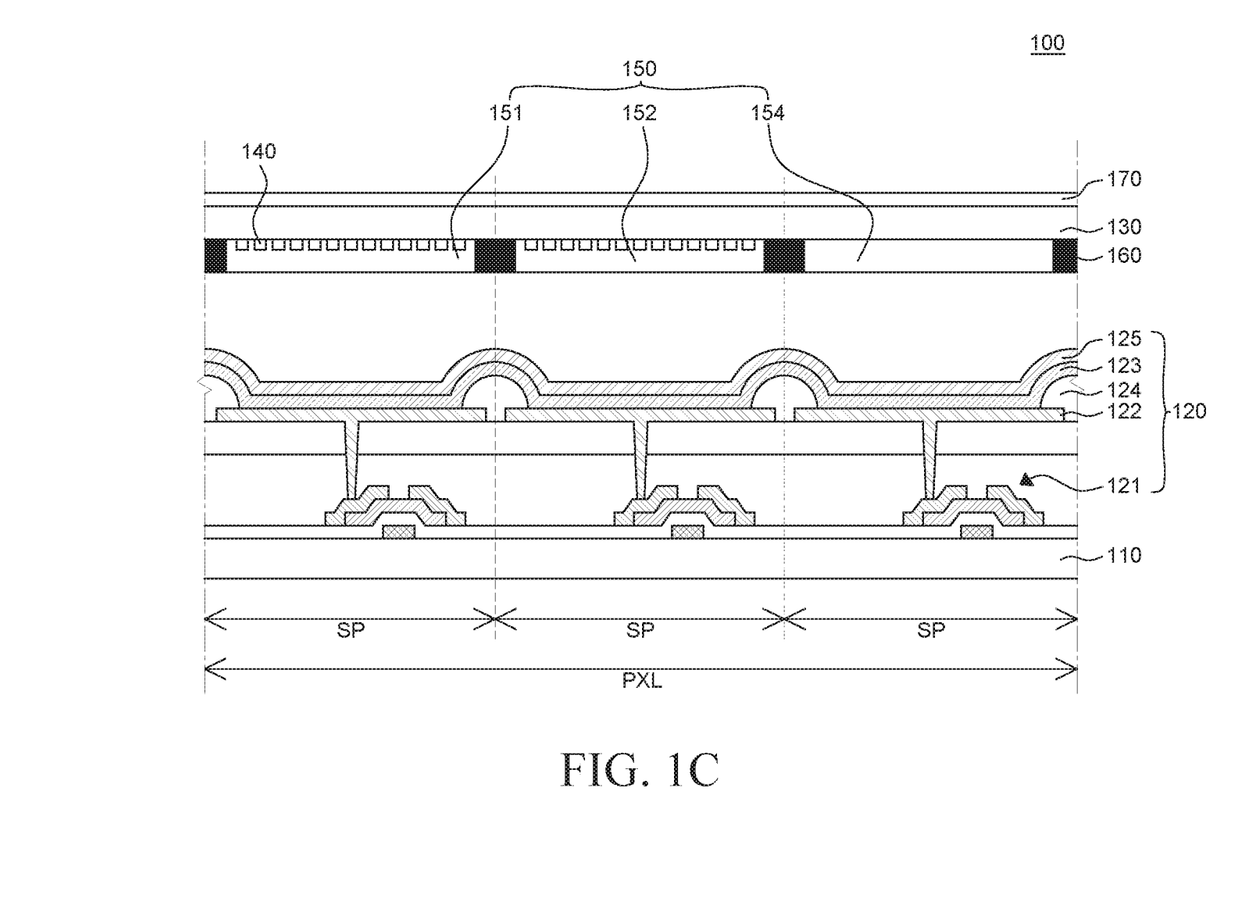
FIG. 1C is a schematic cross-sectional view of a display panel including a polarizing emission layer corresponding to a part of subpixels according to an embodiment of the present disclosure.

FIG. 1C is a schematic cross-sectional view of a display panel including a polarizing emission layer corresponding to a part of subpixels according to an embodiment of the present disclosure.

Referring to FIG. 1C, the display panel 100 includes the first substrate 110, the organic light emitting device 120, the second substrate 130, a dummy electrode 140, the polarizing emission layer 150, the black matrix 160, and the polarizing layer 170.

A unit pixel PXL is defined by a plurality of subpixels SP.

The second substrate 130 includes the polarizing emission layer 150 arranged in a region facing at least one subpixel SP.

When a blue organic emission layer for emitting blue light is provided as the organic emission layer 123 of the organic light emitting device 120, a depolarizing emission layer 154 corresponding to a blue subpixel area may selectively include a dummy electrode and quantum rods. Or, a blue organic emission layer may not include the same as shown in FIG. 1B.

Figure 2A:
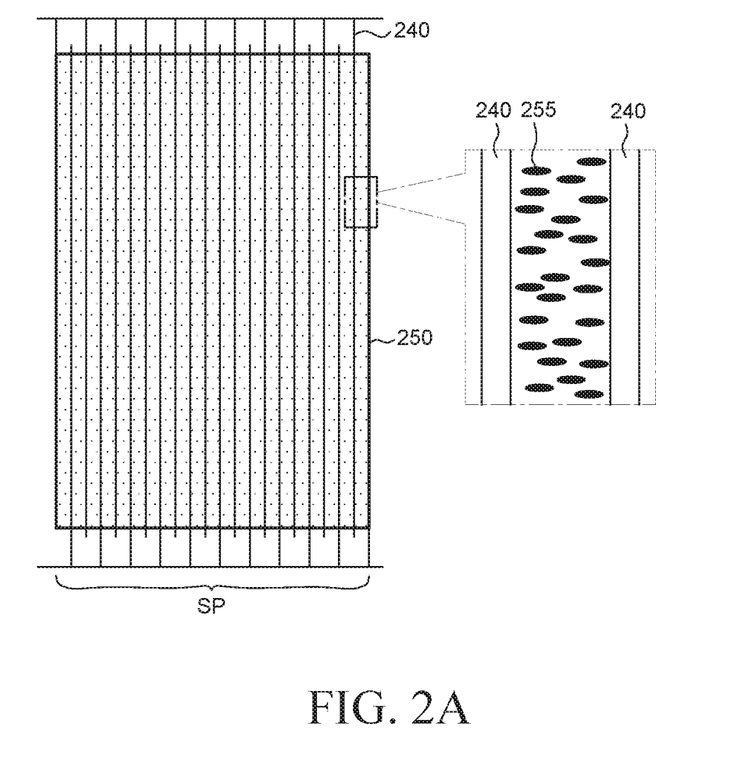
FIG. 2A is a schematic plan view of subpixels including a dummy electrode and a polarizing emission layer, which illustrates polarization of the polarizing emission layer according to an embodiment of the present disclosure.

FIG. 2A is a schematic plan view of subpixels including a dummy electrode and a polarizing emission layer, which illustrates polarization of the polarizing emission layer according to an embodiment of the present disclosure.

Referring to FIG. 2A, a dummy electrode 240 and a polarizing emission layer 250 are formed to correspond to the area of a unit subpixel SP. The dummy electrode 240 may be a transparent electrode formed of a transparent conductive oxide.

The polarizing emission layer 250 is formed on the dummy electrode 240. The polarizing emission layer 250 includes quantum rods 251.

In forming the polarizing emission layer 250, the dummy electrode 240 may be used as an electrode 240 for aligning the quantum rods 251 included in the polarizing emission layer 250.

When alternating current is applied to the dummy electrode 240, kinetic energy to align the directions in which the quantum rods 251 are arranged is generated by dipole moment. Thereby, the longitudinal axes of the quantum rods 251 are aligned towards the dummy electrode 240 arranged on both sides of the quantum rods 251.

Figure 2B:
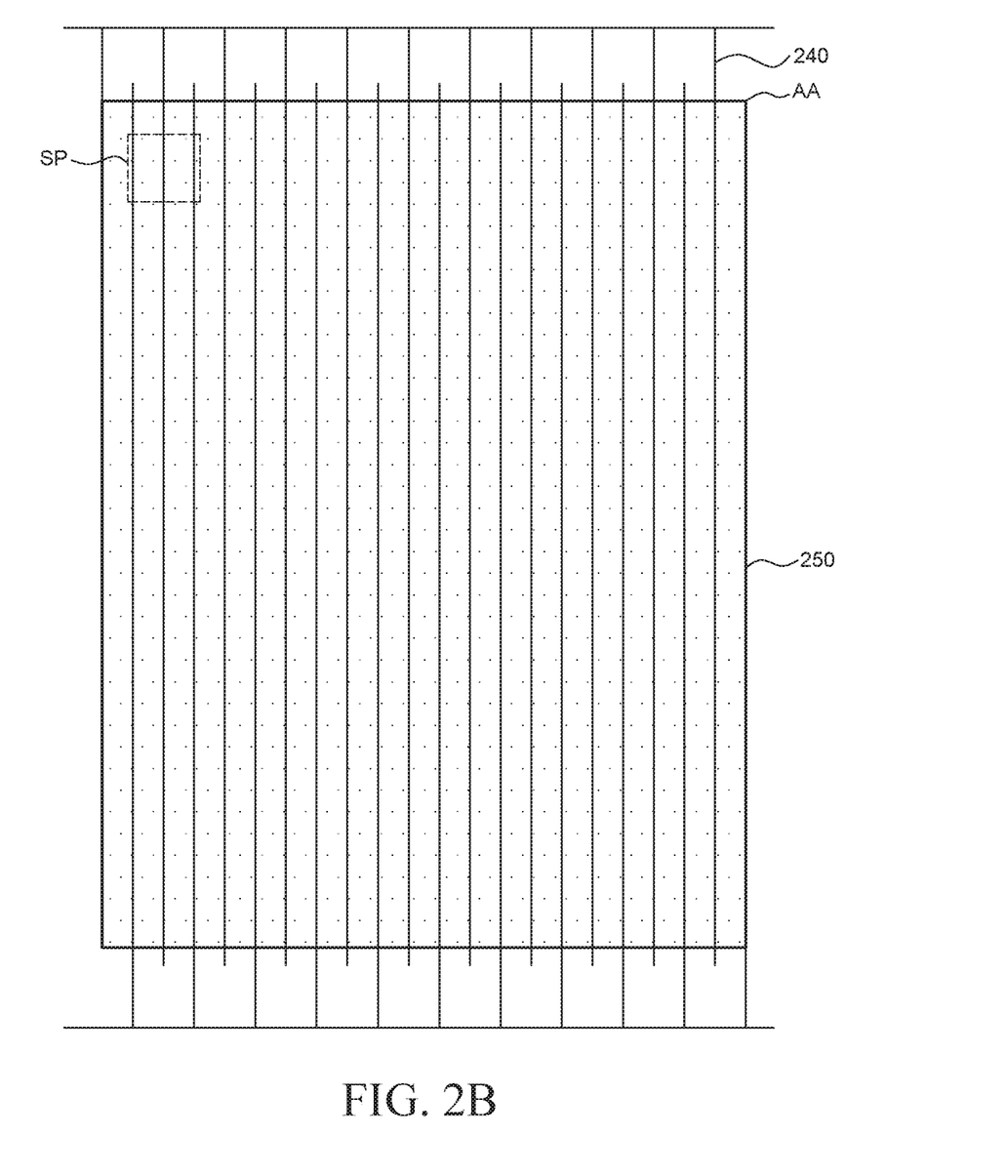
FIG. 2B is a schematic plan view of a display panel, which illustrates polarization of a polarizing emission layer according to an embodiment of the present disclosure.

FIG. 2B is a schematic plan view of a display panel, which illustrates polarization of a polarizing emission layer according to an embodiment of the present disclosure.

Referring to FIGS. 2A and 2B, the dummy electrode 240 is formed in an active area AA of a display panel including at least one subpixel SP. A plurality of dummy electrodes 240 may be formed in the area of each subpixel SP as shown in FIG. 2A. Further, the dummy electrodes 240 may vertically extend over the active area AA as shown in FIG. 2B. The dummy electrode may be formed to correspond to the polarizing emission layer.

Figure 3A:
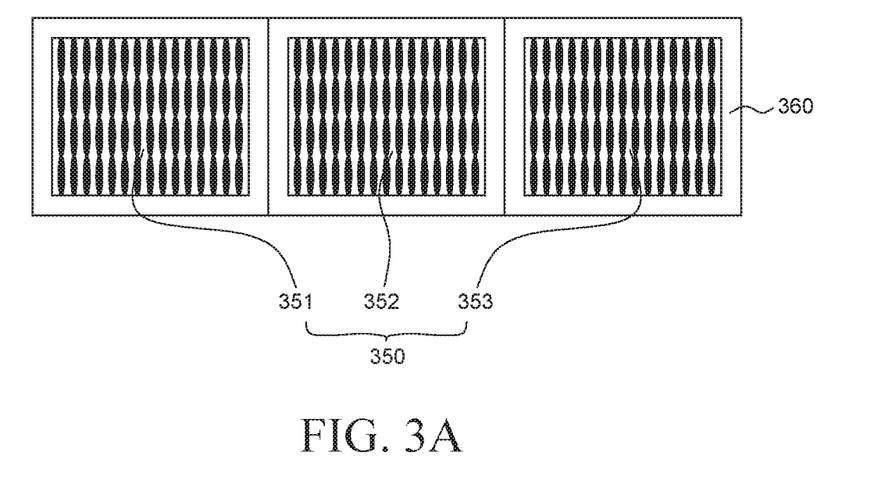
FIGS. 3A and 3B are schematic plan views illustrating examples of various unit pixels defined by subpixels including a polarizing emission layer according to an embodiment of the present disclosure.
Figure 3B:
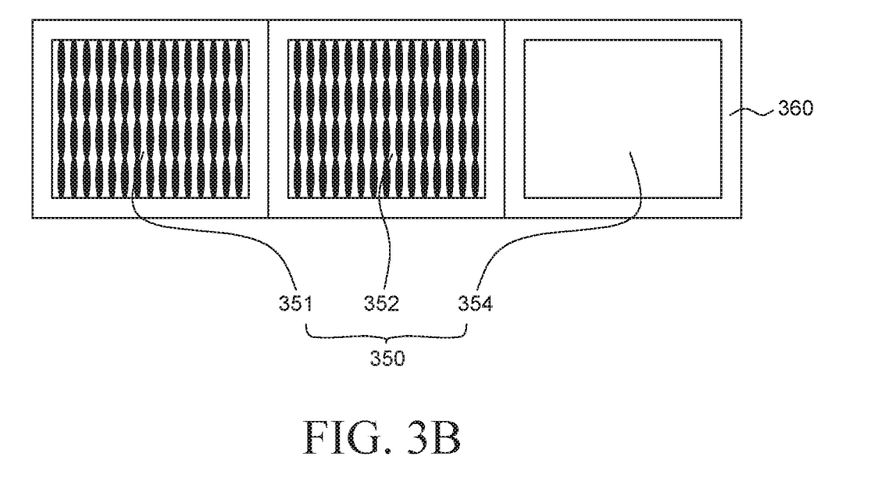

FIGS. 3A and 3B are schematic plan views illustrating examples of various unit pixels defined by subpixels including a polarizing emission layer according to an embodiment of the present disclosure.

Referring to FIGS. 3A and 3B, a polarizing emission layer 350 including quantum rods is interposed among unit subpixels.

As shown in FIG. 3A, a unit pixel may be configured using a red polarizing emission layer 351, a green polarizing emission layer 352, a blue polarizing emission layer 353 and a black matrix 360.

Alternatively, a unit pixel may be configured using the red polarizing emission layer 351, the green polarizing emission layer 352 and a depolarizing emission layer 354, as shown in FIG. 3B. In this case, the depolarizing emission layer 354 may be formed not to include a quantum rod. When the unit pixel is configured as shown in FIG. 3B, light incident on the polarizing emission layer may be blue light.

Figure 4A:
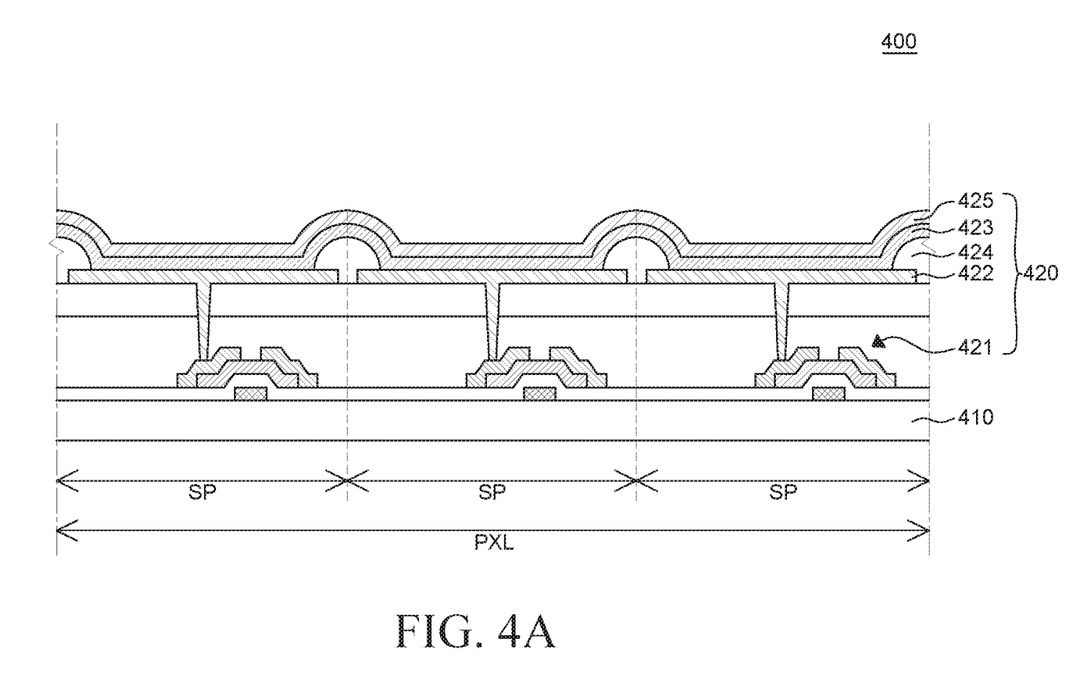
FIGS. 4A to 4C are schematic cross-sectional views illustrating a method for manufacturing a display panel including a polarizing emission layer according to an embodiment of the present disclosure.
Figure 4B:
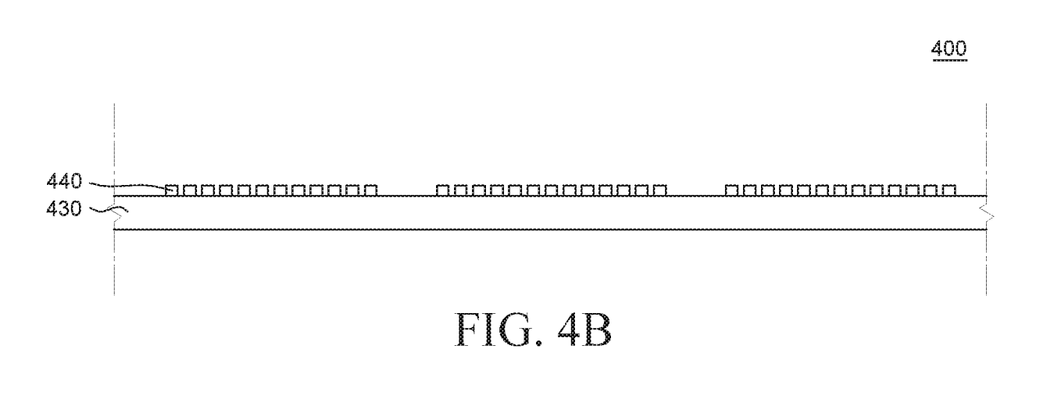
Figure 4C:
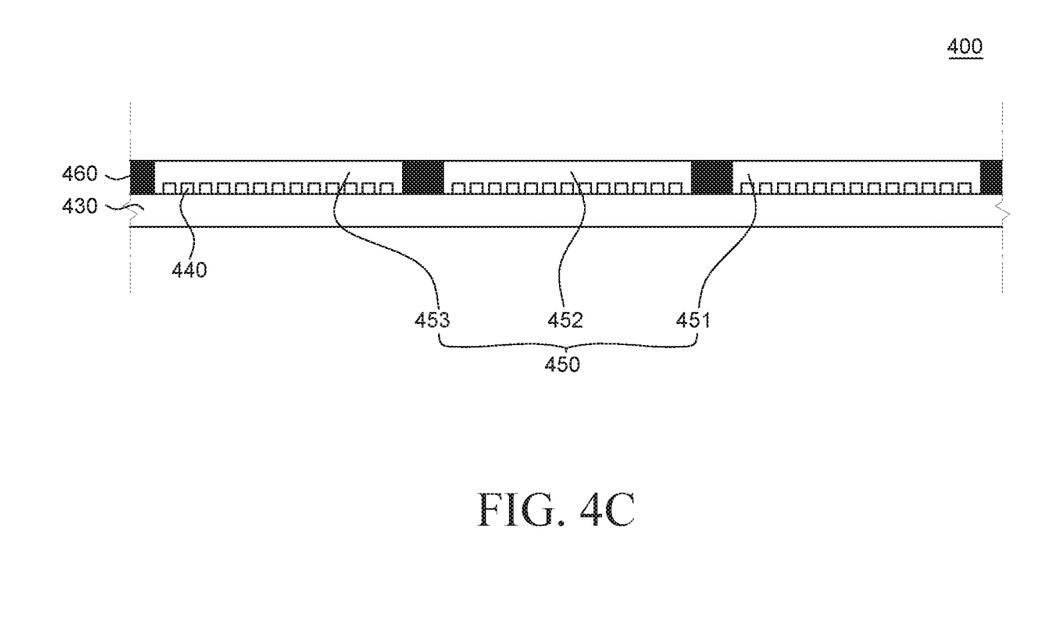

FIGS. 4A to 4C are schematic cross-sectional views illustrating a method for manufacturing a display panel including a polarizing emission layer according to an embodiment of the present disclosure.

Referring to FIG. 4A, a driving device 421, a pixel electrode 422, an organic emission layer 423, a common electrode 425 and a bank layer 424 are formed on a first substrate 410 to correspond to the area of subpixels SP defining a unit pixel PXL.

Herein, the organic emission layer 423 may be formed of an organic material emitting deep blue light or an organic material emitting light of a UV wavelength, or may be a white organic emission layer. However, embodiments of the present disclosure are not limited thereto.

Referring to FIG. 4B, dummy electrodes 440 are formed on a second substrate 430 by patterning. The dummy electrodes 440 may have a pattern as shown in FIG. 2A and FIG. 2B, but embodiments of the present disclosure are not limited thereto. The dummy electrodes 440 may be formed by patterning through etching with a mask. Patterning may be performed such that the dummy electrodes 440 have a comb pattern.

Preferably, the width of the electrode line of each dummy electrode 440 is 2 μm, and the electrodes are spaced apart by about 2 μm. However, embodiments of the present disclosure are not limited thereto.

Referring to FIG. 4C, a black matrix 460 and a polarizing emission layer 450 are formed on the second substrate 430 having the dummy electrodes 440 formed thereon.

The polarizing emission layer 450 includes quantum rods. The polarizing emission layer 450 includes a red polarizing emission layer 451, a green polarizing emission layer 452 and a blue polarizing emission layer 453, which are distinguishably formed according to types of quantum rods therein. The polarizing emission layer 450 is formed by applying quantum rods mixed with a volatile solvent onto the substrate.

In forming the polarizing emission layer 450, an alternating current voltage is applied to the dummy electrode 440 such that the quantum rods included in the polarizing emission layer 450 are aligned.

Thereafter, the first substrate 410 is attached to the second substrate 430.

Exemplary embodiments of the present disclosure have been described in detail above with reference to the accompanying drawings. Those skilled in the art will appreciate that the present disclosure is not limited to the exemplary embodiments, and various modifications and variations can be made in the present disclosure without departing from the spirit or scope of the disclosure. Accordingly, the exemplary embodiments described herein are merely illustrative and are not intended to limit the scope of the present disclosure. The technical idea of the present disclosure is not limited by the exemplary embodiments. Therefore, the embodiments described herein should be construed in all aspects as illustrative and not restrictive. The scope of protection sought by the present disclosure should be determined by the appended claims and their legal equivalents, and all changes coming within the meaning and equivalency range of the appended claims are intended to be embraced therein.

What is claimed is:

1. A display panel comprising:
    a first substrate having a plurality of unit pixels, each of the unit pixels including a plurality of subpixel areas;
    a second substrate facing the first substrate;
    an organic light emitting device corresponding to the subpixel areas on the first substrate;
    a polarizing emission layer between the organic light emitting device and the second substrate, and corresponding to at least one of the subpixel areas; and
    a plurality of dummy electrodes within the polarizing emission layer, wherein the dummy electrodes are transparent electrodes.

2. The display panel according to claim 1, wherein the organic light emitting device comprises a driving device, a pixel electrode, an organic emission layer and a common electrode.

3. The display panel according to claim 2, wherein the organic emission layer is a blue organic emission layer.

4. The display panel according to claim 2, wherein the organic emission layer is an ultraviolet (UV) organic emission layer capable of emitting light of a UV wavelength.

5. The display panel according to claim 2, wherein the common electrode is a transparent electrode.

6. The display panel according to claim 1, wherein the dummy electrodes are disposed to correspond to the polarizing emission layer.

7. The display panel according to claim 1, wherein the polarizing emission layer comprises quantum rods.

8. The display panel according to claim 7, wherein the quantum rods are selected from red quantum rods, blue quantum rods and green quantum rods.

9. The display panel according to claim 1, further comprising a polarizing layer on the second substrate.

10. The display panel according to claim 9, wherein a polarization direction of the polarizing emission layer coincides with a polarization direction of the polarizing layer.

* * * * *